(12) United States Patent
Posamentier

(10) Patent No.: US 7,316,509 B2
(45) Date of Patent: Jan. 8, 2008

(54) APPARATUS FOR ELECTRICAL AND OPTICAL INTERCONNECTION

(75) Inventor: Joshua D. Posamentier, Oakland, CA (US)

(73) Assignee: Intel Corporation, Santa Clara, CA (US)

( * ) Notice: Subject to any disclaimer, the term of this patent is extended or adjusted under 35 U.S.C. 154(b) by 73 days.

(21) Appl. No.: 10/882,906

(22) Filed: Jun. 30, 2004

(65) Prior Publication Data

US 2006/0002663 A1    Jan. 5, 2006

(51) Int. Cl.
    *G02B 6/42* (2006.01)
(52) U.S. Cl. .............................. 385/88; 385/76; 385/94
(58) Field of Classification Search ............ 385/88–94
    See application file for complete search history.

(56) References Cited

U.S. PATENT DOCUMENTS

| | | | | |
|---|---|---|---|---|
| 4,798,918 | A | 1/1989 | Kabadi et al. ................. | 174/36 |
| 4,845,311 | A | 7/1989 | Schreiber et al. ............. | 174/36 |
| 6,164,838 | A | 12/2000 | Maehara et al. .............. | 385/92 |
| 6,322,257 | B1 | 11/2001 | Kryzak ........................ | 385/88 |
| 6,353,189 | B1 | 3/2002 | Shimada et al. ............ | 174/255 |
| 6,496,291 | B1 | 12/2002 | Raj et al. .................... | 359/152 |
| 6,797,891 | B1 * | 9/2004 | Blair et al. ................. | 174/268 |
| 6,870,257 | B2 * | 3/2005 | Zhong et al. ............... | 257/700 |
| 2002/0075107 | A1 * | 6/2002 | Burdick et al. ............. | 333/260 |
| 2003/0085452 | A1 * | 5/2003 | Brezina et al. ............. | 257/666 |
| 2003/0103734 | A1 | 6/2003 | Brezina et al. ............... | 385/88 |
| 2003/0173663 | A1 | 9/2003 | Kami et al. ................. | 257/728 |
| 2004/0105629 | A1 | 6/2004 | Cheng et al. ................. | 385/89 |

FOREIGN PATENT DOCUMENTS

| | | |
|---|---|---|
| JP | 2000277814 | 10/2000 |
| JP | 2002353508 | 12/2002 |
| WO | WO 01/42840 | 6/2001 |

OTHER PUBLICATIONS

International Search Report received in International (PCT) Application PCT/US2005/022367, mailed Dec. 2, 2005.
Written Opinion of the International Search Authority for Application PCT/US2005/022367, mailed Dec. 2, 2005.

* cited by examiner

*Primary Examiner*—Frank G. Font
*Assistant Examiner*—Eric Wong
(74) *Attorney, Agent, or Firm*—Marshall, Gerstein & Borun LLP

(57) ABSTRACT

An optical-electronic interface may include a circuit substrate, an electrical component mounted on the substrate, an optical component mounted off the substrate, and a flexible interconnect having a first end electrically connected to the optical component and second end electrically connected proximate to the optical component. The electrical component may include electrical leads and the circuit substrate may include electrically conductive traces connected to the electrical leads. The second end of the flexible interconnect may be electrically connected directly to the electrical leads of the electrical component or directly to the electrically conductive traces at a position located proximate to the electrical component. A flexible optoelectronic interconnect may include a first and second dielectric layer, a signal layer with a signal trace disposed between the dielectric layers, ground plane layers on the first and second dielectric layers and a plurality of vias electrically coupling the first and second ground layers.

30 Claims, 2 Drawing Sheets

APPARATUS FOR ELECTRICAL AND OPTICAL INTERCONNECTION

FIELD OF THE TECHNOLOGY

The application relates generally to electrical-optical interconnections, and, more particularly, to a flexible optoelectronic interconnect connecting electrical devices on a circuit substrate with optical devices.

BACKGROUND

Optoelectronic devices, such as optical transponders and optical transceivers, for example, generally involve interconnection between an optical component and an electrical component. For example, optical sub-assemblies, such as transmitting optical sub-assemblies (TOSA) and receiving optical sub-assemblies (ROSA), were connected directly to an optical edge of a circuit substrate, such as a printed circuit board (PCB), by directly soldering or epoxying the electrical leads of the optical sub-assembly to signal traces embedded on or in the circuit substrate. Placement of the optical component was thereby limited, resulting in limitations for the design and manufacture of the optoelectronic device. The optoelectronic device also included several electrical components, such as a serializer/deserializer, a clock and data recovery unit, or other high speed electrical components. Generally, these electrical components were mounted on the circuit substrate towards an electrical edge, or card edge connector, of the circuit substrate which was opposite the optical edge. The traces within the circuit substrate were used as the interconnect between the electrical component and the optical component and ran from the optical edge to the electrical component near the electrical edge.

In some cases, the optical component was provided with a short flexible interconnect, such as a flexible circuit. One end of the flexible interconnect was electrically connected to the optical component via the electrical leads, and another end of the flexible interconnect was electrically connected to embedded signal traces at the optical edge of the circuit substrate. As above, the traces ran along the circuit substrate from the optical edge to the electrical component positioned towards the electrical edge. The flexible interconnect generally included two unshielded layers: a trace layer and a ground plane layer. The ground plane layer was generally positioned on one side of the flexible interconnect and a controlled impedance stripline was positioned on the opposite side of the flexible interconnect. Generally, the flexible interconnect was approximately 10 mm in length. The short length of the flexible interconnect limited flexibility and prohibited mounting additional components on the interconnect rather than on the circuit substrate. In turn, the design options for the optoelectronic device, for example, placement of optical components, circuit substrate size and PCB design, were limited.

One or more signal traces ran from the optical edge to the electrical component near the electrical edge regardless of how the optical component was connected to the optical edge of the circuit substrate. The optical component was connected directly or via a short flexible interconnect. The trace on the circuit substrate was generally a line or "wire" of conductive material such as copper, silver or gold, and resided on the surface of or within the circuit substrate. The traces carried electronic signals between the optical component and the electrical component. However, the circuit substrate was generally lossy and the traces resulted in interference among the electronic signals. For example, a transmitting differential signal to the optical component sometimes interfered with a receiving differential signal from the optical component. The electrical signals further experienced interference from other components on the circuit substrate. Although an amplifier was sometimes used when receiving differential signals from the optical component, transmitting differential signals often had low signal strength, and were more susceptible to the interference and the lossy nature of the circuit substrate described above.

Electrical components in addition to those described above were also mounted on the circuit substrate. Some of these additional components were proprietary to the particular optical component or components. As such, the design and manufacture of the printed circuit board would vary depending on the optical component.

DETAILED DESCRIPTION OF THE EXAMPLES

Figure 1:
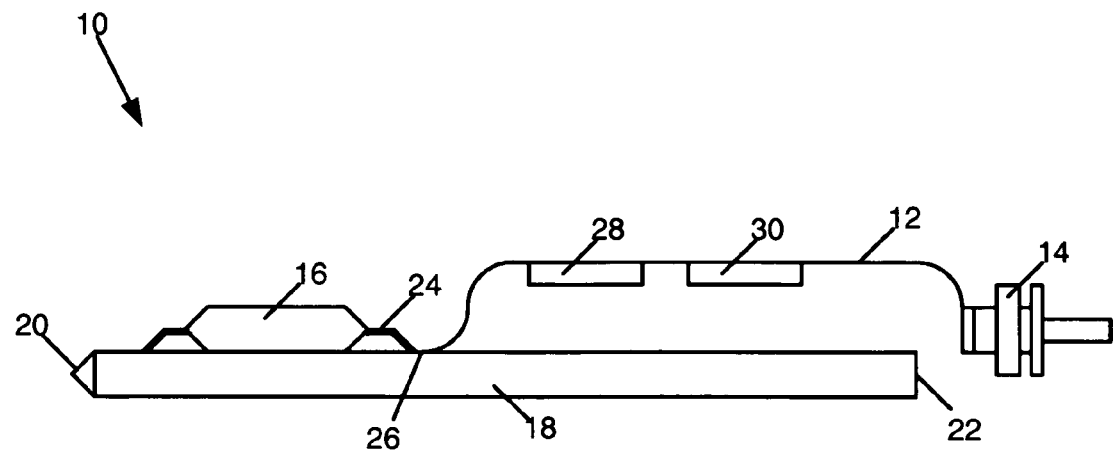
FIG. 1 is a block diagram of an optical-electronic interface including interconnecting an optical component with an electrical component on a circuit substrate with a flexible optoelectronic interconnect.

An example of an optical-electrical interface using a flexible optoelectronic interconnect 12 is shown generally in FIG. 1. Although the flexible interconnect 12 is particularly well-suited for optical transponders, optical transceivers, or the like, the teachings of the present application are not limited to any particular type of optoelectronic device. On the contrary, the teachings of the application can be employed with virtually any optoelectronic device involving optical and electrical interconnections. Thus, although the flexible interconnect 10 will be described below primarily in relation to a small form factor optical transponder with pluggable optics, the apparatus could likewise be used with any type of form-factor optical transponder or optical transceiver, optical front end (OFE) sub-assemblies (single-mode or multi-mode), receiver optical sub-assemblies (ROSA), transmitter optical sub-assemblies (TOSA), Multi-Source Agreement (MSA), and compatible packaging, for example. In addition, although described primarily as a flexible circuit interconnecting transistor outline (TO)-can packaged optical components with high speed electrical components such as clock and data recovery (CDR) units and serializer/deserializers (SERDES) units, the flexible interconnect 12 may be utilized to interconnect any optical component with an electrical component on a circuit board.

Referring to FIG. 1, an optical-electrical interface 10 includes a flexible interconnect 12 connecting an optical component 14 to an electrical component 16. The interface 10 may be any optoelectronic interface, including, but not limited to, optical transponders including small form-factor transponders with pluggable optics and Multi-Source Agreement (MSA) compliant optoelectronic devices, for example. In particular, the optical component 14 includes various optical devices such as TO-can packaged pluggable optics and TO-header based optical sub-assemblies such as TOSA and ROSA, ceramic planar optics packages, receiver diodes, and laser diodes, for example.

The electrical component 16 is mounted on a circuit substrate 18, such as a printed circuit board (PCB). The circuit substrate 18 may be, but is not limited to, a ceramic substrate such as an alumina substrate, an aluminum nitride (AlN) substrate or a silicon substrate. The circuit substrate 18 includes a first edge 20 and a second edge 22 opposite the first edge 20. First edge 20 may correspond to an electrical edge, or card edge connector, that interfaces with a physical layer interface such as a backplane or bus. The second edge 22 may correspond to an optical edge. The optical component 14 is mounted off of the circuit substrate 18 and may be positioned near the second edge 22. However, the position of the optical component 14 may vary according to the design of the optoelectronic device. The placement of the circuit substrate 18 may likewise vary according to the design of the optoelectronic device (for example, plane-wise with respect to the card edge connector).

As shown in FIG. 1, the electrical component 16 is mounted on the circuit substrate 18 proximate to the first edge 20. The electrical component 16 may be a passive or active electrical component, a packaged or bare silicon electrical component, a clock and data recovery unit, a serializer/deserializer, an amplifier such as a transimpedance amplifier (TIA), a laser diode driver, a re-timer, and other small form factor high speed electrical components, for example. Generally, the electrical component 16 is not proprietary to the particular type of optical component 14. In one example, all of the electrical components 16 mounted on the circuit substrate 18 may be independent of the particular optical component or components 14 being utilized. Although FIG. 1 demonstrates that the electrical component 16 may be mounted on the circuit substrate 18 using wire bonded electrical leads 24, the electrical component 16 may be mounted on the circuit substrate 18 utilizing various surface mount technologies, including, but not limited to flip chip mounting to provide solder bump electrical leads 24. In another example, the circuit substrate 18 may include electrically conductive traces 26 mounted on or embedded in the circuit substrate 18, and extending from the electrical leads 24 (wire bonds or solder bump). The electrically conductive traces 26 are short in length, on the order of a few millimeters or less, in order to minimize cross-interference and to minimize potential lossy effects due to the circuit substrate 18.

The flexible interconnect 12 extends from the optical component 14 to the electrical component 16. The flexible interconnect 12 includes a first end and a second end. The first end is electrically connected to the optical component 14 by soldering, epoxying or otherwise adhering and electrically connecting the conductive components of the flexible interconnect 12 to electrical leads on the ceramic substrate 18 of the optical component 14. As shown in FIG. 1, the flexible interconnect 12 may extend over a large portion of the circuit substrate 18 with the opposing end of the flexible interconnect 12 connected to the electrically conductive traces 26. The electrically conductive traces 26 are of short length, such that the second end of the flexible interconnect 12 connects with the electrically conductive traces 26 proximate to the electrical component 16 via soldering, epoxying or other form of adhering to establish an electrical connection with the electrical leads 24. Thus, any differential signal being transmitted between the optical component 14 and the electrical component 16 includes only a short run along the circuit substrate 18 to minimize interference and lossy effects.

Figure 2:
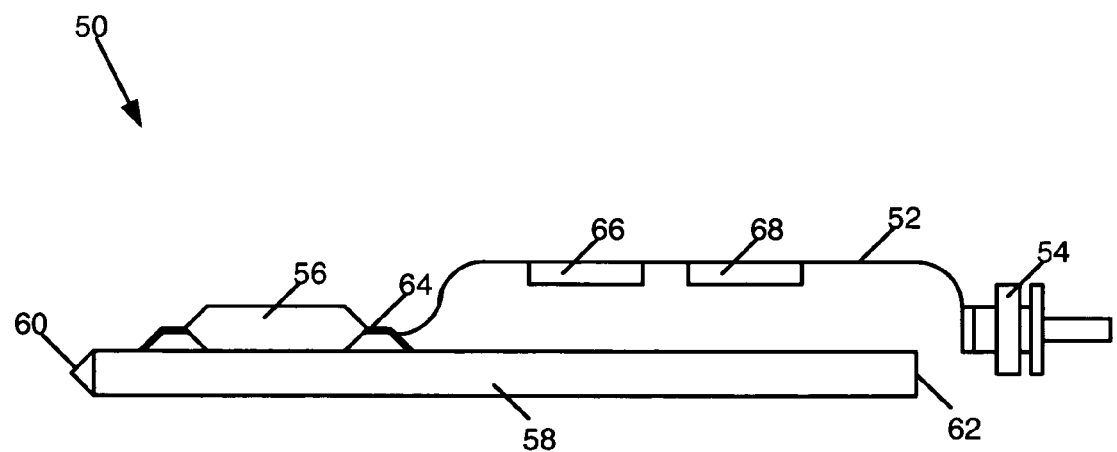
FIG. 2 is a block diagram of an alternative example of an optical-electronic interface interconnecting an optical component with an electrical component on a circuit substrate with a flexible optoelectronic interconnect.

As shown in FIG. 2, a second example of optical-electrical interface 50 includes a flexible interconnect 52 connecting an optical component 54 to an electrical component 56. The flexible interconnect 52 may be connected to an optical component 54, as above. The electrical component 56 is mounted on a circuit substrate 58, which may be similar to the circuit substrate 18. In particular, the circuit substrate 58 includes a first edge 60 and a second edge 62 opposite the first edge 60. The first edge 60 may correspond to an electrical edge, or card edge connector, that interfaces with a physical layer interface such as a backplane or bus. The second edge 62 may correspond to an optical edge. The electrical component 56 may be mounted on the circuit substrate 58 using wire bonded electrical leads 64. The optical component 54 is mounted off of the circuit substrate 58 and may be positioned near the second edge 52. In addition, the flexible interconnect 52 may run a majority of the length of a circuit substrate 58 to the electrical component 56, and circuit elements 66, 68 may be mounted on the flexible interconnect 52 as discussed further below.

However, instead of connecting to electrically conductive traces mounted on or embedded in the circuit substrate 58, the flexible interconnect 52 may connect directly to the electrical component 56 via the electrical leads 64, or other electrical interface provided with the electrical component 56, including, but not limited to, wire bonds or solder bumps provided on an upper surface of the electrical component 56. In effect, a differential signal may be transmitted between the electrical component 56 and the optical component 54 without being transmitted through any traces mounted on or embedded in the circuit substrate 58. The differential signals are thereby not subject to any interference or lossy effects due to traces and/or the circuit substrate 58. In turn, the sensitivity of the optical component 54, such as a receiving optical component, may be improved.

Referring again to FIG. 1, circuit elements 28, 30 are disposed on the flexible interconnect 12. The circuit elements 28, 30 are also electrically coupled to the flexible interconnect 12, and hence the electrical component 16 and the optical component 14. The circuit elements 28, 30 may be mounted via surface mount technology, such as flip chip mounting. In one example, the circuit elements 28, 30 are proprietary to the type of optical component 14 being utilized. The circuit elements may include, for example, direct current (DC) blocks, direct current inserters (bias-Tee's) and radio frequency (RF) matching networks. As shown in FIG. 1, the circuit elements 28, 30 may be mounted on the underside of the flexible interconnect 12, which may also be referred to as a surface of the flexible interconnect 12 facing the circuit substrate 18, to provide protection for the circuit elements 28, 30 and to minimize the size of the outer casing and overall size of the optoelectronic device.

Accordingly, the flexible interconnect 12 permits the optical component 14 to be placed in virtually any location and at any degree of angle with respect to the circuit substrate 18 within the length and tolerances of the flexible interconnect 12. In one example, the length of the flexible interconnect 12 may range from approximately 50 mm to approximately 120 mm.

Further, the same printed circuit board or PCB design may be utilized for different optoelectronic devices, such as different form factor transponders, by mounting only components that are compatible with different optical components 14 on the circuit substrate 18, whereas components that are proprietary to the type of optical component 14 being utilized may be mounted on the flexible interconnect 12. As such, while the flexible interconnect 12 may be soldered, epoxied or otherwise adhered and electrically connected to the electrical leads of the optical component, or components, 14, the other end of the flexible interconnect 12 may be removably coupled with the electrical component 16 via a pluggable interface mounted on the electrical component 16 or on the circuit substrate 18 and electrically coupled to the electrical component 16. A corresponding connector (for example, a mated, pluggable connector) may be provided on, and electrically connected to, the end of the flexible interconnect 12 and adapted to securely interface with the connector provided on the electrical component 16 or circuit substrate 18. The flexible interconnect 12, along with the optical component 14 and optically dependent circuit elements 28, 30, may be easily disconnected from the electrical component 16 and interchanged with other printed circuit boards. Likewise, the same arrangement of electrical components 16 and circuit substrate 18 (for example, the same PCB design) may be used with different types of optical components 14.

In addition to interchangeability and compatibility, the circuit substrate 18 does not require electrically conductive traces running from the optical edge 22 to the electrical component 16 positioned towards the electrical edge 20, thereby providing additional surface area on the circuit substrate 18 for additional components, and/or decreasing the overall size of the circuit substrate 18, and hence the size of the optoelectronic device. Differential signals being transmitted between the electrical component 16 and the optical component 14 are not subject to the lossy effects of the circuit substrate 18 or cross interference.

Figure 3:
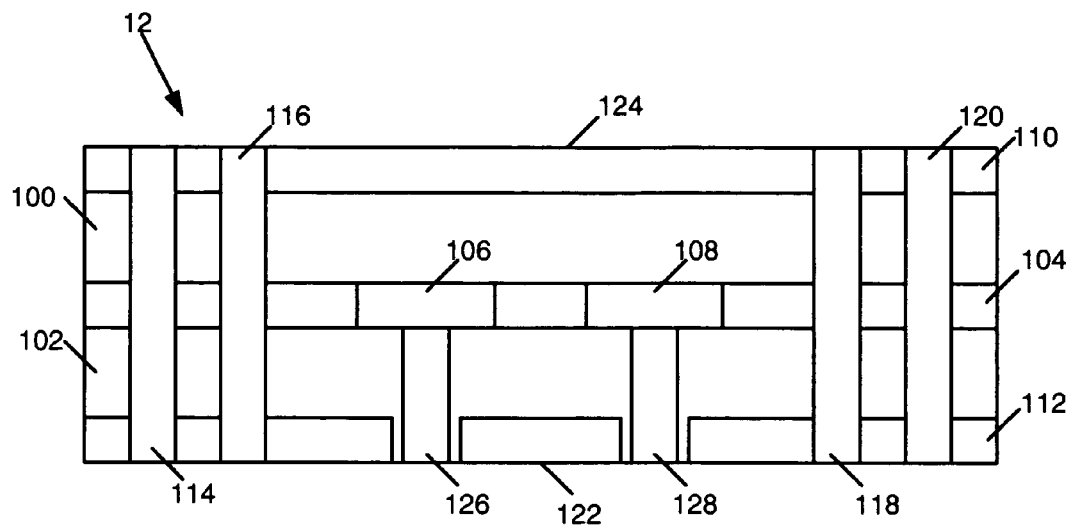
FIG. 3 is a cross-sectional view of the flexible optoelectronic interconnect of FIGS. 1 and 2.

FIG. 3 is a cross section of an example of a flexible optoelectronic interconnect 12 described above in references to FIGS. 1 and 2. The flexible interconnect 12 includes a first dielectric layer 100 and a second dielectric layer 102. A dielectric material used for the first and second dielectric layers 100, 102 may include polyimide, polyester, epoxy, polytetrafluoroethylene, or other suitable, flexible dielectric materials.

The flexible interconnect 12 further includes a signal layer 104 disposed between the first and second dielectric layers 100, 102. The first and second dielectric layers 100, 102 may be laminated on the surfaces of the signal layer 104. The signal layer 104 includes a first signal trace 106 and a second signal trace 108. Additional or fewer signal traces may be provided. The signal traces 106, 108 may be made from an electrically conductive material such as copper, silver, gold or other suitable materials for conducting differential signals, yet maintain strength and flexibility. The first signal trace 106 is electrically isolated from the second signal trace 108 using a filler material between the signal traces 106, 108 and in any other areas within the signal layer 104 to shield the signal traces 106, 108 against interference with each other or with external factors such as static, external signals, lossy effects, for example. The filler material may be the same material used for the first and second dielectric layers 100, 102, such as polyimide, polyester, epoxy and polytetrafluoroethylene, for example.

The signal traces 106, 108 may each be provided as differential trace pairs. In one example, the signal traces 106, 108 shown in FIG. 3 may be viewed as a single differential trace pair. Alternatively, the signal traces 106, 108 may each be provided as single-ended striplines or coplanar stripline waveguides. Referring to FIG. 3, the flexible optoelectronic interconnect 12 may be viewed as two single-ended stripline configurations. If the signal layer 104 is provided with just one signal trace, the signal trace may be provided as a single-ended stripline trace.

The flexible interconnect 12 further includes a first ground plane layer 110 disposed on the first dielectric layer 100, and a second ground plane layer 112 disposed on the second dielectric layer 102. The ground plane layers 110, 112 may be made of the same conductive material as the signal traces 106, 108, including copper, silver, and gold, for example. The ground plane layers 110, 112 are electrically coupled to one another using a plurality of vias 114, 116, 118, 120 extending through the first and second dielectric layers 100, 102 and the signal layer 104, while being spaced apart from the signal traces 106, 108 to provide electrical isolation. In one example, the vias 114, 116, 118, 120 may be spaced along the length of the flexible interconnect 12. The ground plane layers 110, 112 and the vias 114, 116, 118, 120 may together provide a Faraday cage, also known as a Faraday shield, to protect the signal traces 106, 108 against electrostatic interference. In effect, any external or electrostatic charge or electrical interference may reside on the outer surface 122, 124 of the ground plane layers 110, 112 and the vias 114, 116, 118, 120 without interfering with the signals being transmitted through the signal traces 106, 108. An additional dielectric shielding (not shown) may be provided around the entire flexible interconnect 12 to electrically isolate the ground planes 110, 112 from external interference.

As discussed with respect to FIG. 1, circuit elements 28, 30 may be disposed on a surface 122 of the flexible interconnect 12 facing the circuit substrate 18. The circuit elements 28, 30 may be electrically coupled to the flexible interconnect 12, and, in particular, may be electrically coupled to one or more of the signal traces 106, 108. Additional vias 126, 128 may thereby be provided through openings in the ground plane layer 112. The vias 126, 128 may be electrically isolated from the ground plane layer 112 using a dielectric filler material, which may be an extension of the second dielectric layer 102.

The signal traces 106, 108 may thereby be provided in a stripline configuration for interconnection between the optical components 14 and the electrical components 16. In one example, both of the signal traces 106, 108 may be coupled to a single optical component 14 and a single electrical component 16. However, in another example, one signal trace 108, which may be a single-ended trace or differential trace pair, is connected to an optical component 14 and an electrical component 16 used for receiving signals, whereas the other signal trace 108, which may also be a single-ended trace or differential trace pair, is connected to an optical component 14 and an electrical component 16 used for transmitting signals. The spacing between the signal traces 106, 108 and/or the filler material for the signal layer 104 may be provided to ensure electrical isolation between the signal traces 106, 108. The first and second signal traces 106, 108 may each have a controlled impedance of approximately 50 ohms if provided as single-ended traces or a controlled impedance of approximately 100 ohms if provided as differential trace pairs.

Figure 4:
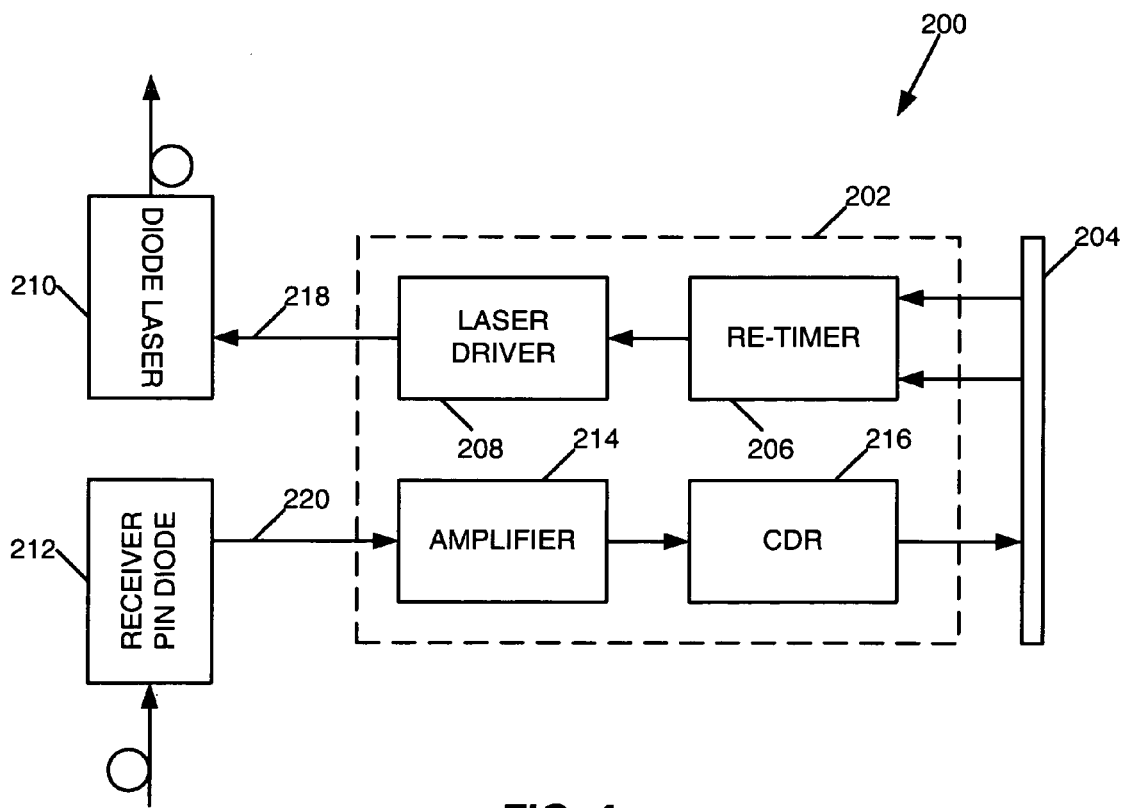
FIG. 4 is a block diagram of an example of an optical transponder which includes the optical-electronic interface of FIG. 1 or 2.

FIG. 4 is a block diagram of an example of an optical transponder 200 with the optical-electronic interface shown schematically in FIG. 1 or 2. Referring to FIG. 4, the optical transponder 200 includes a circuit substrate 202, such as the circuit substrate 18 described above. The optical transponder 200 may include various small form-factor electrical components, such as a re-timer, a laser driver, a clock and data recovery unit, a serializer/deserializer and an amplifier, for example, some or all of which may be dependent on or independent of the type of optical components being utilized. Any electrical components that are dependent on the type of optical components may be mounted on the flexible interconnect, wherein electrical components independent of the optical components may be mounted on the substrate as part of the PCB design. In addition, the optical transponder 200 may include various optical components such as a transmitting optical sub-assembly and a receiving optical sub-assembly, for example. The optical components may include transistor-outline (TO)-can packaged pluggable optics or optical components having other packaging types.

A card-edge connector 204 may provide an interface with a bus or backplane and is operatively coupled to a re-timer 206 mounted on the circuit substrate 202 proximate to the card-edge connector 204. The re-timer 206 is operatively coupled to a laser driver 208 which may be mounted on the circuit substrate 202 or may be mounted on a flexible interconnect, as discussed above. The laser driver 208 is operatively coupled to a diode laser 210 and utilized to drive the diode laser 210. The diode laser 210 is mounted off the circuit substrate 202. Although a diode laser 210 is shown, as may be found with a transmitting optical sub-assembly, other transmitting optical components may also be utilized.

A receiver positive-intrinsic-negative (PIN) diode 212 is also provided off of the circuit substrate 202. The receiver PIN diode 212 is operatively coupled to an amplifier 214 which is mounted on the circuit substrate 202. Alternatively, the amplifier 214, which may be a transimpedance amplifier, may be mounted on the flexible interconnect. The amplifier 214 is operatively coupled to a clock and data recovery unit 216 mounted on the circuit substrate 202. The card-edge connector 204 is further operatively coupled to the clock and data recovery unit 216 mounted on the circuit substrate 202 proximate to the card-edge connector 204.

A flexible interconnect 218, disclosed above as the flexible interconnect 12 or the flexible interconnect 52, may operatively couple the diode laser 210 with the laser driver 218 and/or the re-timer 206. As discussed with respect to the electrical component 14, 54, the laser driver 208 may be mounted on a surface of the flexible interconnect 218 facing the circuit substrate 202 which may then be connected proximate to the re-timer 206, either directly or via short-run electrically conductive traces. Alternatively, the flexible interconnect 218 may be connected proximate to the laser driver 208 if mounted on the circuit substrate 202, either directly or via short-run electrically conductive traces.

Likewise, a flexible interconnect 220, disclosed above as the flexible interconnect 12 or the flexible interconnect 52, may operatively couple the receiver diode 212 with the amplifier 214 and/or the clock and data recover unit 216. The flexible interconnect 220 may be provided with the flexible interconnect 218 as additional signal traces or as a separate interconnect. The amplifier 214 may be mounted on a surface of the flexible interconnect 220 facing the circuit substrate 202, which may then be connected proximate to the clock and data recover unit 216, either directly or via short-run electrically conductive traces. Alternatively, the flexible interconnect 220 may be connected proximate to the amplifier 214 if mounted on the circuit substrate 202, either directly or via short-run electrically conductive traces.

As seen in FIG. 4, the optical components 210, 212 may be positioned in different directions relative to the circuit substrate 202 and relative to each other, which may allow for flexibility in design of the optical transponder 200 both with respect to size, shape and printed circuit board design. Each of the optical components 210, 212 may be coupled with the remainder of the optical transponder 200 via a pluggable connector, as disclosed with respect to FIG. 1, thereby allowing the optical component 210, 212, and any corresponding optically dependent circuit elements, to be easily disconnected from remainder of the optical transponder 200. The optical components 210, 212 may thereby be used with different printed circuit board designs beyond the circuit substrate 202 and the electrical components 206, 216 (and electrical components 208, 214 if mounted on the circuit substrate 202) shown in FIG. 4. Likewise, different optical components may be used with the printed circuit board design that are compatible with the electrical components 206, 216, and electrical components 208, 214 if not proprietary to a particular type of optical component.

Although certain apparatus constructed in accordance with the teachings of the invention have been described herein, the scope of the invention is not limited thereto. On the contrary, the invention includes all embodiments of the teachings of the invention fairly falling within the scope of the appended claims either literally or under the doctrine of equivalents.

What is claimed is:

1. An optical-electrical interface comprising:
a circuit substrate;
an electrical component mounted on the circuit substrate;
an optical component; and
a flexible interconnect having a first end electrically and physically connected to the optical component and a second end having a terminus edge electrically and physically connected immediately adjacent to the electrical component, wherein the electrical component is mounted off the flexible interconnect and wherein the flexible interconnect comprises:
a signal layer comprising a first signal trace and a second signal trace electrically isolated from the first signal trace, the signal layer having a first surface and a second surface;
a first dielectric layer disposed on the first surface of the signal layer; and
a second dielectric layer disposed on the second surface of the signal layer.

2. The optical-electrical interface of claim 1, wherein the electrical component comprises one or more electrical leads connected directly to the second end of the flexible interconnect.

3. The optical-electrical interface of claim 1,
wherein the circuit substrate comprises one or more electrically conductive traces;
wherein the electrical component comprises one or more electrical leads connected to the one or more electrically conductive traces;
wherein the second end of the flexible interconnect is directly connected to the one or more electrically conductive traces at a position located immediately adjacent to the electrical component.

4. The optical-electrical interface of claim 1, further comprising one or more circuit elements disposed on the flexible interconnect and electrically coupled to the flexible interconnect.

5. The optical-electrical interface of claim 4, herein the flexible interconnect comprises a surface facing the circuit substrate, wherein the one or more circuit elements are disposed on the surface facing the circuit substrate.

6. The optical-electrical interface of claim 4, wherein the one or more circuit elements comprise at least one of the following: a direct current block, a direct current inserter and a radio frequency matching network.

7. The optical-electrical interface of claim 1 wherein the flexible interconnect comprises a flexible circuit.

8. The optical-electrical interface of claim 1 wherein the flexible interconnect further comprises:
one or more vias disposed through the first and second dielectric layers and electrically isolated from the first and second signal traces;
a first ground plane layer disposed on the first dielectric layer and electrically connected to the one or more vias; and
a second ground plane layer disposed on the second dielectric layer and electrically connected to the one or more vias.

9. The optical-electrical interface of claim 1, wherein the first signal trace is electrically connected to a transmitting optical component and the second signal trace is electrically connected to a receiving optical component.

10. The optical-electrical interface of claim 1, wherein the first signal trace is electrically and physically connected immediately adjacent to a transmitting electrical component and the second signal trace is electrically and physically connected immediately adjacent to a receiving electrical component.

11. The optical-electrical interface of claim 1, wherein at least one of the first and second signal traces comprises one of the following: a stripline trace, a single-ended trace or a differential trace.

12. The optical-electrical interface of claim 1, wherein the electrical component comprises one of the following: a small form factor electrical component, an active electrical component, a passive electrical component, a packaged silicon electrical component or a bare silicon electrical component.

13. The optical-electrical interface of claim 1, wherein the optical component comprises a pluggable transistor outline optical component.

14. The optical-electrical interface of claim 1, wherein the optical component is mounted off the circuit substrate.

15. A flexible optoelectronic interconnect comprising:
a first dielectric layer;
a second dielectric layer;
a signal layer disposed between the first and second dielectric layers, the signal layer comprising a first signal trace having a first end adapted for electrically coupling with an optical component and a second end adapted for electrically coupling with an electrical component;
a first ground plane layer disposed on the first dielectric layer;
a second ground plane layer disposed on the second dielectric layer; and
a plurality of vias electrically coupling die first ground plane layer and the second around plane layer.

16. The interconnect of claim 15, further comprising a second signal trace electrically isolated from the first signal trace.

17. The interconnect of claim 15, wherein the first ground plane layer, the second ground plane layer and the plurality of vias comprise a Faraday shield around the first signal trace.

18. The interconnect of claim 15, wherein the first signal trace comprises one of the following: a stripline trace, a single-ended trace or a differential trace pair.

19. The interconnect of claim 15, wherein the first signal trace comprises a controlled impedance of approximately 50 ohms.

20. The interconnect of claim 15, wherein the first signal trace comprises a controlled impedance of approximately 100 ohms.

21. An optical transponder comprising:
a circuit substrate;
a first electrical component mounted on the circuit substrate;
a second electrical component mounted on the circuit substrate;
a receiving optical component mounted off the circuit substrate;
a transmitting optical component mounted off the circuit substrate; and
a flexible interconnect having a first end electrically connected to the receiving optical component and the transmitting optical component, and a second end having a terminus edge electrically and physically connected immediately adjacent to the first and second electrical components, wherein the first and second electrical components are mounted off the flexible interconnect, the flexible interconnect operatively coupling the receiving optical component with the first electrical component and operatively coupling the transmitting optical component with the second electrical component.

22. The optical transponder of claim 21,
wherein the circuit substrate comprises a first edge and a second edge opposite the first edge;
wherein the first and second electrical components are mounted on the circuit substrate immediately adjacent to the first edge; and
wherein the receiving optical component and the transmitting optical component are mounted off the circuit substrate and positioned immediately adjacent to the second edge.

23. The optical transponder of claim 21, further comprising one or more circuit elements disposed on the flexible interconnect and electrically coupled to the flexible interconnect.

24. The optical transponder of claim 21, wherein the flexible interconnect comprises a surface facing the circuit substrate, wherein the one or more circuit elements are disposed on the surface facing the circuit substrate.

25. The optical transponder of claim 21, wherein the flexible interconnect comprises a first signal trace and a second signal trace electrically isolated from the first signal trace, wherein the first signal trace operatively couples the receiving optical component with the first electrical component and the second signal trace operatively couples the transmitting optical component with the factor electrical component.

26. The optical transponder of claim 21, wherein the flexible interconnect comprises:
a signal layer comprising a first signal trace and a second signal trace electrically isolated from the first signal trace, the signal layer having a first surface and a second surface;
a first dielectric layer disposed on the first surface of the signal layer;
a second dielectric layer disposed on the second surface of the signal layer;
one or more vias disposed through the first and second dielectric layers and electrically isolated from the first and second signal traces;
a first ground plane disposed on the first dielectric layer and electrically connected to the one or more vias; and a second ground plane disposed on the second dielectric layer and electrically connected to the one or more vias.

27. The optical transponder of claim 21, wherein the first electrical component comprises one of the following: a clock and data recovery component, a serializer/deserializer or an amplifier.

28. The optical transponder of claim 21, wherein the second electrical component comprises one of the following: a laser driver or a re-timer.

29. The optical transponder of claim 21, wherein the receiving optical component comprises a receiving optical sub-assembly.

30. The optical transponder of claim 21, wherein the transmitting optical component comprises a transmitting optical sub-assembly.

* * * * *

UNITED STATES PATENT AND TRADEMARK OFFICE
CERTIFICATE OF CORRECTION

| | | |
|---|---|---|
| PATENT NO. | : 7,316,509 B2 | |
| APPLICATION NO. | : 10/882906 | |
| DATED | : January 8, 2008 | |
| INVENTOR(S) | : Posamentier | |

It is certified that error appears in the above-identified patent and that said Letters Patent is hereby corrected as shown below:

In the Claims:

At Column 8, line 60, "herein" should be -- wherein --.

At Column 9, line 53, "die" should be -- the --.

At Column 9, line 54, "around" should be -- ground --.

Signed and Sealed this

Fourteenth Day of June, 2011

David J. Kappos
*Director of the United States Patent and Trademark Office*